US007556971B2

(12) United States Patent
Peacock et al.

(10) Patent No.: US 7,556,971 B2
(45) Date of Patent: Jul. 7, 2009

(54) TESTING ELECTROMIGRATION AT MULTIPLE POINTS OF A SINGLE NODE

(75) Inventors: Scott Christopher Peacock, Fort Collins, CO (US); Gayvin Earl Stong, Ft. Collins, CO (US); Wynce Lam, Sunnyvale, CA (US); Richard Ira Dowell, Saratoga, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 401 days.

(21) Appl. No.: 11/142,207

(22) Filed: Jun. 1, 2005

(65) Prior Publication Data

US 2006/0275935 A1     Dec. 7, 2006

(51) Int. Cl.
*H01L 21/66* (2006.01)
(52) U.S. Cl. .............................. 438/14; 438/10; 438/17

(58) Field of Classification Search .................... 438/10, 438/11, 14, 17, 18; 716/4, 6, 11
See application file for complete search history.

(56) References Cited

U.S. PATENT DOCUMENTS 5,943,487 A * 8/1999 Messerman et al. ........... 716/11

* cited by examiner

*Primary Examiner*—Kevin M Picardat

(57) ABSTRACT

Systems and methods for testing the reliability of a semiconductor component are disclosed herein. One embodiment of a method for testing reliability, among others, comprises providing simulation code of a standard cell, wherein the standard cell represents the semiconductor component. The method includes extracting foliage points of a node of the standard cell and running a reliability test on each foliage point. Then, the standard cell can be characterized by the worst performing foliage point. A foliage point, for example, may be defined as a portion of a node that can be connected to a wire or route leading to external circuitry.

13 Claims, 4 Drawing Sheets

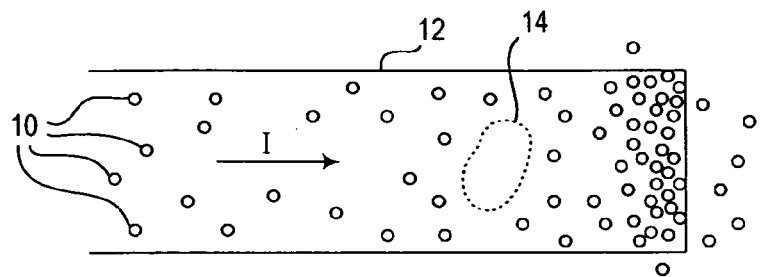
FIG. 1
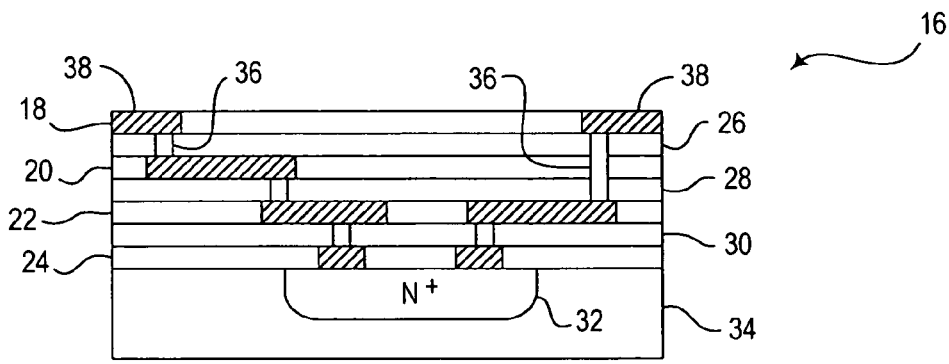
FIG. 2
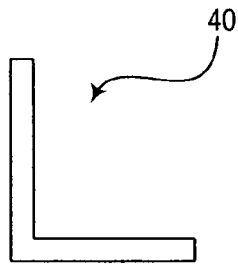 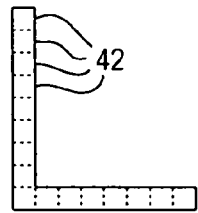 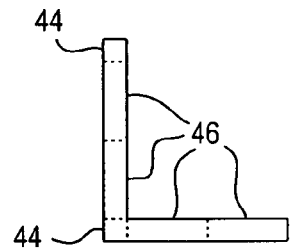
FIG. 3A   FIG. 3B   FIG. 3C
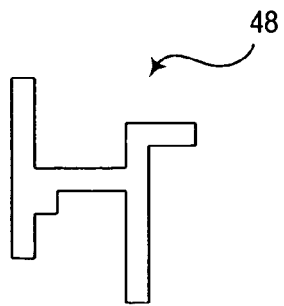 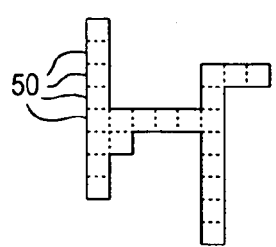 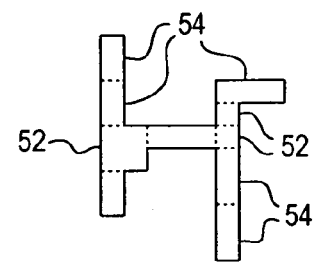
FIG. 4A   FIG. 4B   FIG. 4C

TESTING ELECTROMIGRATION AT MULTIPLE POINTS OF A SINGLE NODE

TECHNICAL FIELD

The present application relates to reliability testing for a semiconductor component of an integrated circuit. More particularly, the present application relates to electromigration testing at a number of points on a node of a semiconductor component.

BACKGROUND

Integrated circuits can be designed and fabricated with hundreds of semiconductor components formed on a single substrate. Each semiconductor component generally comprises conductive paths having relatively small cross-sectional areas. Because of this small dimension, a component will occasionally provide non-linear conductive properties. During different stages of manufacture of the integrated circuits, reliability tests are performed to assure that the semiconductor components will be operational within certain guidelines. One such reliability test is an "electromigration" test.

Electromigration is a phenomenon in which the metal ions of a metal conductor will tend to migrate in the direction of flow of current through the conductor. FIG. 1 illustrates an example of how metal ions 10 can migrate over time along a conductor 12, even migrating beyond the boundary of the conductor 12 itself. Factors that contribute to electromigration include the cross-sectional area of the conductor 12, current density through the conductor 12, and temperature. Over the course of time, the metal ions 10 of the conductor 12 can migrate to such a degree that voids 14 are created where the ions have left. These voids 14, when large enough, can impede the flow of current and therefore present a noticeable increase in resistance of the conductor 12. In an extreme condition, electromigration can create voids that span across the width of the conductor 12, thereby electrically isolating one portion of the conductor 12 from another and resulting in an open circuit condition.

Another problem that can result from electromigration is a situation in which some of the metal ions migrate from the conductor 12 into the surrounding semiconductor material. In this situation, if enough ions are imposed upon the surrounding semiconductor material, the material will act more like a conductor than a semiconductor and the component will not operate as it was designed.

It is therefore important to test for electromigration in order to understand the limitations of a semiconductor component or to identify ways in which the semiconductor component can be improved. Since electromigration usually becomes evident only after an extended amount of time, one way to test electromigration is by a time-accelerated method. In this method, a "test pattern" is used to represent a semiconductor component and a high current is applied to the test pattern at an elevated temperature. The test pattern is observed to determine how it changes during this relatively short amount of time so that a prediction can be made as to how the conductors of the actual semiconductor component might change during the normal life of the component. During this test, a sensor detects any changes in resistance of the test pattern as a result of the application of the high current and temperature. A noticeable change in resistance signifies a potential electromigration problem.

When electromigration tests, or other types of reliability tests, are run on a number of semiconductor components, records can be maintained of each semiconductor component defining the performance characteristics of the components under certain condition. With these records, a circuit designer can choose a component having desired characteristics for a particular design need. Usually, the records of the cells can contain information such as the maximum capacitive load of the component, frequency response, etc.

Until now, however, assumptions have been made concerning how the cells are characterized or defined. These assumptions can provide inaccurate records that falsely categorize a component as being reliable under certain conditions when in fact it may actually fail. Because of these assumptions, present-day simulation devices cannot be accurately created to accommodate all possible variables in the design of the components.

Therefore, it would be desirable to recognize some of these often-used testing assumptions and provide a technique for testing semiconductor components in order to more accurately characterize the components and overcome the inaccuracies caused by the prior assumptions. With knowledge of the inaccurate assumptions, a more thorough and more accurate testing method can be performed to provide reliable characterization analyses of semiconductor components with the assurance that the components can meet new characterization criteria as established therefor, even in a worst case scenario.

SUMMARY

Systems and methods for testing the reliability of a semiconductor component are described in the present disclosure. One embodiment of a method for testing reliability, among others, comprises providing simulation code of a standard cell, where the standard cell represents the semiconductor component. The method includes extracting foliage points of a node of the standard cell and running a reliability test on each foliage point. Then, the standard cell can be characterized by the worst performing foliage point. A foliage point, for example, may be defined as a portion of a node that can be connected to a wire, trace, or route, leading to external circuitry.

This method may further be defined in that the reliability test is an electromigration test. Also, in particular, the node defined in this method can be, for example, an output node. In addition, the disclosure includes software programs that are configured to perform the processes of this method.

Furthermore, this method can be defined more particularly, wherein extracting foliage points further comprises analyzing the shape of the node and running a partitioning algorithm, based on the shape of the node, for splitting the shape into a number of separate foliage points. The method may then include determining an equivalent RC circuit for each foliage point and combining the RC circuits to create a circuit representing the node.

For example, a software program is described herein that is executable by a computer for characterizing a node of a semiconductor component. The software program comprises logic configured to obtain a standard cell, in which the standard cell represents the semiconductor component. The software program further includes logic configured to partition a node of the standard cell into a plurality of portions, logic configured to test each portion, and logic configured to characterize the node based on the test results.

The present disclosure further includes a method for improving the operating range of a standard cell. This method comprises analyzing the shape of a node of a standard cell that represents a semiconductor component. The method also includes determining an operating range of the standard cell based on the shape of the node, and modifying the shape of the node to improve the operating range.

Furthermore, this method may be further defined in that analyzing the shape of the node further comprises splitting the node into a plurality of foliage points and testing the operating range of each foliage point. Also, the operating range as defined in this method may correspond, for instance, to a prediction of electromigration.

BRIEF DESCRIPTION OF THE DRAWINGS

Many aspects of the embodiments of the present disclosure can be better understood with reference to the following drawings. The components in the drawings are not necessarily to scale, emphasis instead being placed upon clearly illustrating the principles of the present disclosure. Like reference numerals designate corresponding parts throughout the several views.

FIG. 1 is an illustration showing the effects of the electromigration phenomenon on a conductor.

FIG. 2 is a side view of an exemplary multi-layered semiconductor component formed on a substrate.

FIG. 3A is a plan view of an exemplary shape of an output node of a semiconductor component.

FIGS. 3B and 3C are plan views of the exemplary shape of FIG. 3A in which the shape is divided into portions according to different partitioning algorithms.

FIG. 4A is a plan view of another exemplary shape of an output node of a semiconductor component.

FIGS. 4B and 4C are plan views of the exemplary shape of FIG. 4A in which the shape is divided into portions according to different partitioning algorithms.

DETAILED DESCRIPTION

Figure 5:
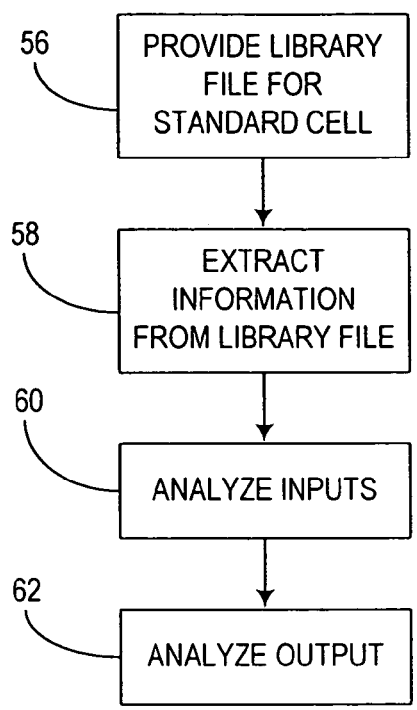
FIG. 5 is a flow chart showing an embodiment of a process for analyzing a standard cell.

Reliability testing, such as electromigration testing, of semiconductor components can be performed using various techniques. However, many techniques in the past rely upon testing assumptions that can result in inaccurate characterizations of the components. For instance, prior art techniques assume that an output node of a semiconductor component physically includes a single point and that an external conductor connected to the output node is connected to the entire node. In reality, however, an output node, or output terminal, may comprise a number of conductive segments connected together to form any number of shapes. With respect to electromigration patterns, the shape of the output node may provide non-uniform migration across the node. Therefore, based on the shape of the output node, a testing technique, as described herein, is used to account for the different migration patterns at different portions of the output node. In this way, a better-defined characterization of the semiconductor component can be obtained.

By analyzing the shape according to the methods used herein, the shape can be divided into a number of parts, and each part can be tested separately. In this way, it can be determined which portion of the output node provides the worst response. The worst responding portion is considered to be the weakest link, so to speak, in characterizing the cell. With this improved characterization of a semiconductor component, more accurate information can be recorded for the semiconductor component. Also, by utilizing the more precise testing methods for obtaining these new component characterizations, the design of the semiconductors may be modified accordingly in order to improve operating range and performance of the component.

As described herein, a copy of each type of semiconductor component is stored as a "standard cell" in a standard cell library. Each standard cell can be retrieved from the library whenever a circuit designer is in need of the corresponding semiconductor component. For example, the standard cell may represent any type of semiconductor component, such as, for example, an inverter, flip flop, NAND gate, etc. The standard cell for one component can be taken from the standard cell library and combined with a number of other components to form a circuit. When combining the components, any portion of a component's output node may be connected to any portion of another component's input node.

However, it may not particularly be known exactly where along these nodes that a connection might be made. For instance, a connection might be made to a middle section of the node, an end section of the node, a corner of the node, or any other portion of the node. As a result, electromigration patterns may not be as predictable as once assumed, since it is now known that electromigration may be different depending on the location of the connection. Therefore, for the sake of properly characterizing the standard cell, the output node should be analyzed at each point thereof. Such detailed testing, as described herein, provides the reassurance that the component will operate properly within its established characterization standards even if the worst performing portion of the node is actually connected to the external circuitry.

Although electromigration testing may actually be done on any part of the semiconductor component, the examples herein will describe analysis of the output node only. However, it should be recognized that related testing can be performed on any part of the semiconductor component, such as the input nodes, output nodes, internal nodes, or along conductors or other elements of the semiconductor component.

One method involves analyzing the shape of the output node to determine particular characteristics of the shape. Then, the method includes partitioning the output node into a number of portions using any suitable partitioning algorithm. The partitioning algorithm can use any number of factors to divide the shape into portions. For example, the partitioning algorithm may take into account the location of vias, the locations where the width of the metal changes, locations where the direction of the metal changes, etc. Each portion can then be tested individually. In this respect, if a connection is made to the output node, the semiconductor component can be expected to perform as well as its worst performing portion. Therefore, the component will be characterized according to the limitations of this worst performing portion.

Preferably, the semiconductor components to be tested are standard components that are available from a collection such as a standard cell library. Components from this library will usually have an established structure. However, it will be understood that the structure of these components can be modified with an improved design according to the description herein in order to improve the component's performance. Also, additional components may be created and characterized using the analysis processes described herein. These newly designed components can be also stored in the library for use by other circuit designers. Maximum load, maximum capacitance load, maximum frequency, physical or structural features, and other parameters for defining the characterization of the semiconductor components can be defined.

FIG. 2 shows a side view of an exemplary semiconductor component 16. As illustrated in FIG. 2, the semiconductor component 16 may include multiple conductive layers 18, 20, 22, and 24, multiple insulative layers 26, 28, and 30, and semiconductive layers 32, formed on a substrate 34. Conductive paths may be formed on the various layers, vias 36 may connect adjacent layers, and nodes in the form of pads 38, or other suitable termination component, may be formed on the layers.

Preferably, the testing methods described herein are performed in a simulation environment as opposed to testing a fabricated component. Also, instead of testing the semiconductor component using a test pattern, such as a sacrificial sample or the like, as mentioned above with respect to known time-accelerated testing processes, it is preferable that testing be run using a simulation program, such as a Simulation Program with Integrated Circuit Emphasis (SPICE) tool. In this way, costly fabrication processes can be eliminated during the testing process. Additional simulation software may be incorporated for testing electromigration or testing a prediction of electromigration. This electromigration testing code can be run in conjunction with SPICE or other simulation tool to test electromigration under a range of circuit conditions, e.g. applied power, frequency, load, etc.

FIG. 3A illustrates an example of a node 40, e.g. an output node, which has a particular shape. In the example of FIG. 3A, the node 40 has a shape like the letter "L". It will be understood by one of ordinary skill in the art that the node 40 may have any shape as defined for the particular semiconductor component stored as a standard cell in the standard cell library. For example, the node 40 may be in the shape of multiple conductive traces or patterns, preferably connected together at right angles. They may have a "U" shape, "L" shape, "E" shape, or any other conceivable shape.

As mentioned above, when several components are combined together to form a circuit on an integrated circuit, conductors in the form of wires or "routes" connect outputs from some components to inputs of other components. A "router" software routine lays the routes to connect the components together. The routes may be configured to be connected to any part of the input or output nodes of the components. The prior assumption, however, is that any part of this node will provide the same results. However, if an output node is designed having a shape in which multiple portions of the node may be connected to external circuitry, then it should be understood that connection to different portions of the node might provide different results, especially with respect to electromigration. Therefore, as described herein, the output nodes of various standard cells can be analyzed to determine electromigration patterns for each portion of the node. In this way, a more accurate characterization can be made for each standard cell.

FIG. 3B illustrates an example of how the shape of FIG. 3A can be divided. In this case, the "L" shape is divided into a number of equal sized square portions 42 using a first partitioning algorithm. In FIG. 3C, the shape is divided using a different partitioning algorithm such that the output node in divided into a number of squares 44 and rectangles 46. It should be understood that the shape of the output node 40 can be divided into any combination of different shapes using any suitable partitioning algorithm. The shape and size of the individual portions may depend, for instance, on the lengths and angles of the conductors making up the node 40. Also, the individual portions may be partitioned based on factors such as the location of vias between the layers of the semiconductor component, the location where the width of the trace changes, the location where the direction of the trace changes, etc. The individual portions 42, 44, 46, derived from the whole node 40, are referred to herein as "foliage points." Foliage points represent the areas of the node to which a route may be connected. Analysis of each foliage point of the node is described with reference to FIGS. 5-11 below. Also, an electromigration test can be run on each of these foliage points of the node.

FIG. 4A illustrates an example of another node 48, which may be configured embodying another of the many possible shapes that the output nodes may take. FIG. 4B illustrates one possible partitioning of the shape of FIG. 4A into substantially equal-sized portions 50. FIG. 4C illustrates another partitioning scheme for dividing into different sizes of squares 52 and rectangles 54. Again, shapes 50, 52, 54, as well as any shape derived using any partitioning algorithm for partitioning a node, are defined as foliage points.

FIG. 5 is a flow chart illustrating an embodiment of a general process for performing a characterization test of a standard cell. It should be noted that an original characterization of the standard cell may already exist. In this case, the processes described herein may be used to modify the existing characterization in order to acquire more accurate characterizations.

In block 56, a library file for a standard cell is provided. This library file may be previously stored on or in any suitable storage medium that stores information concerning the physical characteristics of a standard cell representing an already-designed semiconductor component. The library file may also include a characterization of the standard cell that defines the cell with respect to a maximum load, maximum frequency, or other various capacities, under which the cell is able to operate. The library file includes the artwork of the component, including the input and output shapes, etc. In addition, the library file may include a newly created file of a new design for a semiconductor component that is to be stored in the standard cell library.

In block 58, information is extracted from the library file for characterizing the standard cell or modifying the characterization. The information extracted from the library file may be used to test the standard cell for making a more accurate characterization of the standard cell, according to the teachings of the present application. For example, some information that may be extracted for further analysis may be the inputs, outputs, metal structures, physical shapes, etc. of the standard cell. The extraction process will be described in more detail below with respect to FIG. 6. In block 60, the inputs, or input nodes, are analyzed. The analysis of the inputs will be described in more detail below with respect to FIG. 8. In block 62, the output, or output node, is analyzed. If more than one output is present on the standard cell, then at least one of the outputs is analyzed. The analysis of the outputs will be described in more detail below with respect to FIG. 9.

Figure 6:
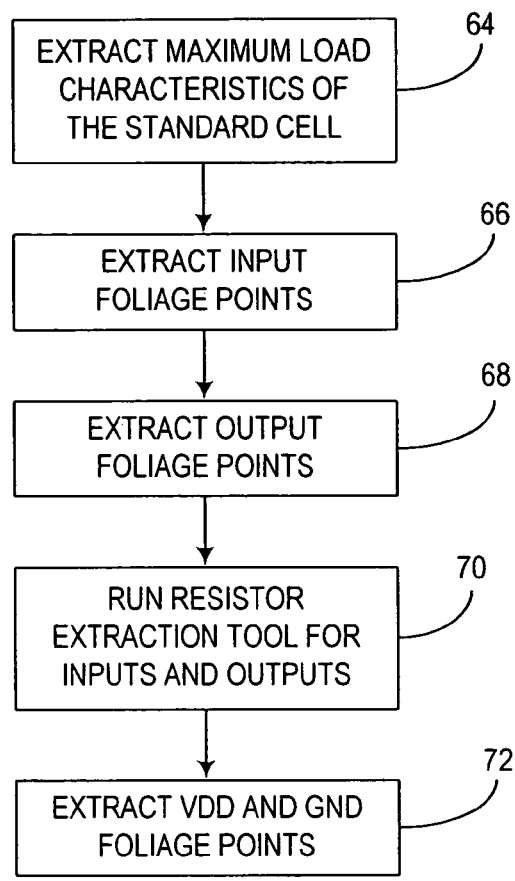
FIG. 6 is a flow chart showing an embodiment of the extraction process shown in FIG. 5.

FIG. 6 is a flow chart illustrating an embodiment of an extraction process for extracting information from a library file of a standard cell. For example, this extraction process may correspond to the functions defined with respect to block 58 shown in FIG. 5. In block 64, the maximum load characterization of the standard cell is extracted from the library file. Typically, the maximum load will have a resistance factor and a capacitance factor. Preferably, though, only the capacitance factor will be used to determine the limitations of the cell. In block 66, input foliage points are extracted, if these points are saved in the file and are available. In this disclosure and as described above, "foliage points" refer to the portions of the node that make up the entire node. Depending on various factors, the foliage points may be configured in the likeness of the portions shown in FIGS. 3B, 3C, 4B, and 4C, for example. In block 68, output foliage points are extracted, if available in the saved file. In block 70, a resistor extraction tool is run for the inputs and outputs of the standard cell. Block 70 may only be necessary when not all of the inputs and outputs are available in the extraction processes of blocks 66 and 68. The resistor extraction tool is used to divide a node, such as an input node or output node, into individual foliage points and determining a resistance component that represents the foliage point. The functions of this tool are defined in more detail below with respect to FIG. 7. In block 72, the power (VDD) and ground foliage points are extracted from the library file. FIG. 6 may also include the extraction of other useful information from the standard file, as necessary, for characterizing the standard cell.

Figure 7:
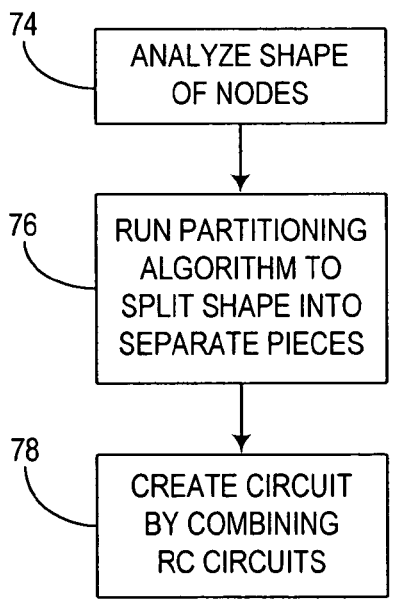
FIG. 7 is a flow chart showing an embodiment of the resistor extraction process shown in FIG. 6.

FIG. 7 is a flow chart illustrating an embodiment of a process for running a resistor extraction tool on a node of a standard cell. For example, this process may correspond to the functions defined with respect to block 70 shown in FIG. 6. In block 74, the resistor extraction tool analyzes the shape of the node being tested. In block 76, based on the analyzed shape, a partitioning algorithm is run to split the shape into a number of separate pieces or foliage points. For example, each of the foliage points may have substantially the same size and shape, such as is shown in FIGS. 3B and 4B, for example. Alternatively, the shape can be analyzed to separate it into a number of different pieces having different sizes and shapes, such as is shown in FIGS. 3C and 4C, for example. The partitioning algorithm also models each foliage point as an RC circuit. In block 78, a circuit representing the node is created by combining the RC circuits together.

Figure 8:
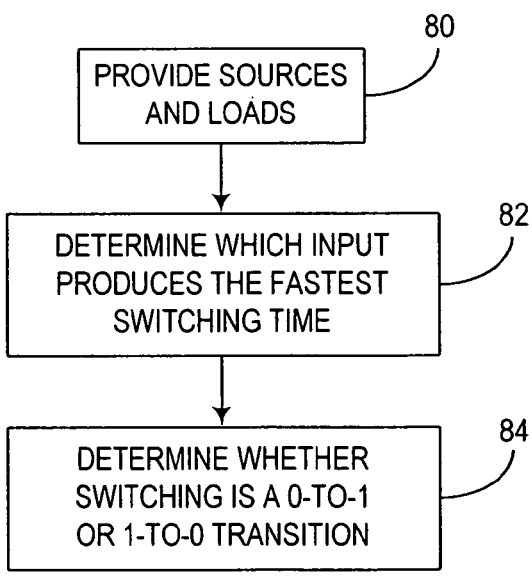
FIG. 8 is a flow chart showing an embodiment of the input analysis process shown in FIG. 5.

FIG. 8 is a flow chart illustrating an embodiment of a process for analyzing inputs of a standard cell. For example, this process may correspond to the functions defined with respect to block 60 shown in FIG. 5. In block 80, the sources and loads are connected to the standard cell in the simulation program to simulate power to the cells under a certain load. In block 82, it is determined which input of the multiple inputs of the standard cell produces the fastest switching time, or, in other words, the input that transitions between a logic low (zero) and a logic high (one) the fastest. Knowing the fastest transitioning input allows this input to be selected for providing the fastest transition for the output. Upon determining the fastest input, the process may also include holding static the other inputs, which may be done by tying the other inputs to ground or power or disconnecting the inputs from external circuitry. In block 84, it is determined whether the fastest switching time is a transition from a logic zero to a logic one or a transition from a logic one to a logic zero.

Figure 9:
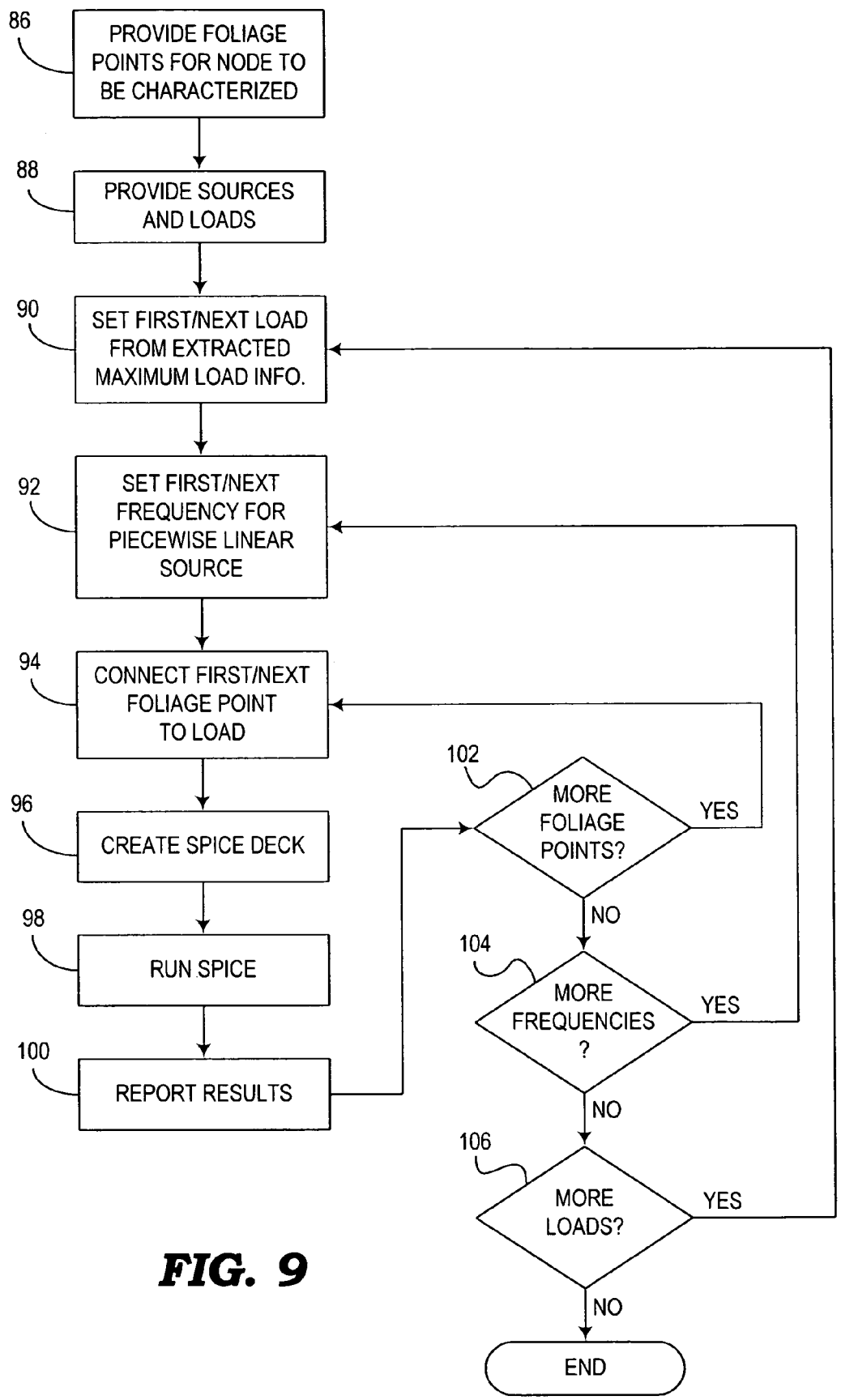
FIG. 9 is a flow chart showing an embodiment of the output analysis process shown in FIG. 5.

FIG. 9 is a flow chart illustrating an embodiment of an output-analyzing process for testing the output foliage points over various frequencies and loads. The functions of this process may correspond to block 62 shown in FIG. 5. In block 86, the foliage points of a node to be characterized are provided. If necessary, this step may also include extracting foliage points if this action has not already been accomplished in earlier steps. Also, this step may comprise the use of a partitioning algorithm to determine the foliage points. Therefore, the foliage points may be extracted from a stored file or determined by a partitioning algorithm. Also, the node to be characterized may also represent a node that has already been characterized but is to be re-characterized using the more accurate characterization processes described herein. The node may be any node of the standard cell, but preferably is the output node.

In block 88, the sources and loads are provided. In block 90, the first capacitive load from the extracted maximum load information is set. In subsequent iterations of this block, the next load is set. In block 92, a first frequency for the piecewise linear source is set. In subsequent iterations of this block, the next frequency is set.

In blocks 94, 96, 98, 100, and 102, a loop is created for allowing each individual foliage point to be tested under the load and frequency conditions set in blocks 90 and 92. Alternatively, a wrapper program can be created around the script to test a range of frequencies for a given foliage point. It will be understood by one of ordinary skill in the art that a wrapper program can be created for any of the load, frequency, and/or foliage points. In block 94, the first foliage point is connected to the load. In subsequent iterations of this block, the next foliage point is connected. In block 96, a SPICE deck is created. The SPICE deck is a script, subroutine, or the like, which uses an electromigration testing tool, as will be explained in more detail below. In block 98, SPICE or another suitable simulation program is run. The simulation program determines the electromigration tendencies of each foliage point of the node to be characterized. In block 100, the results of the SPICE test are reported. The report may be positive, indicating that the foliage point provided favorable results under the specific circuit conditions, or may be negative, indicating that the foliage point did not provide favorable results. In decision block 102, it is determined whether or not anymore foliage points are to be tested. If so, flow loops back to block 94 where the next output foliage point is connected to the load. If no more foliage points are to be tested, flow continues to decision block 104.

In decision block 104, it is determined whether or not any more frequencies are to be tested. This determination is based on the node's ability to operate within certain acceptable parameters at each frequency. When the frequency is pushed beyond the capacity of the node, then no more frequencies will be tested. If the node can be pushed to further limits and more frequencies can be used for testing, then the flow chart loops back to block 92 where the next frequency for the piecewise linear source is set. If not, flow continues to decision block 106. In decision block 106, it is determined whether or not any more loads are to be set. This determination is based on the node's ability to operate within certain acceptable parameters under each load. When the load is too great for the node to handle, then no more loads are applied for the node. If it is determined in block 106 that more loads are to be applied, the flow chart loops back to block 90 where the next load within the range of the extracted maximum load information is set. If no more loads are to be tested, the process ends.

Figure 10:
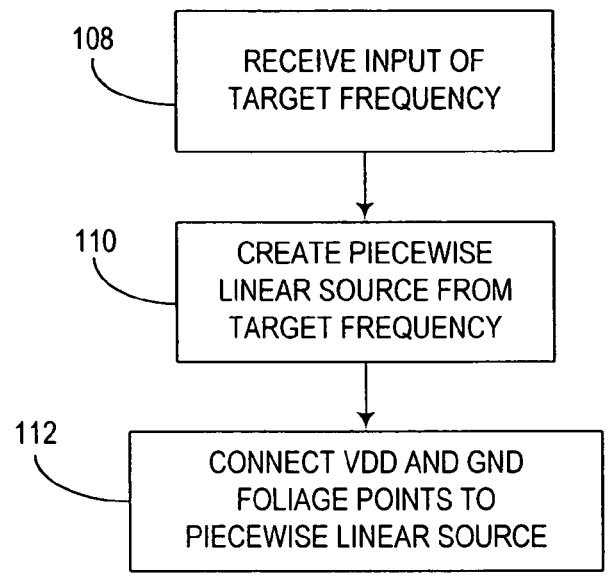
FIG. 10 is a flow chart showing an embodiment of the process for providing the source and load as shown in FIGS. 8 and 9.

FIG. 10 is a flow chart illustrating an embodiment of a process for producing the power waveforms and ground potential. This process may also provide the load parameters for connection to the output node. In block 108, an input of a target frequency is received. In block 110, a piecewise linear source is created from the target frequency. For instance, the piecewise linear source includes script for defining voltage values at specific times, and a linear value is interpolated between these times. In this way, a voltage source or voltage waveform can be defined. Also, this type of power source in a simulation program can be used to control the speed of switching for the inputs. In block 112, the power (VDD) and ground foliage points are connected to the piecewise linear source.

Figure 11:
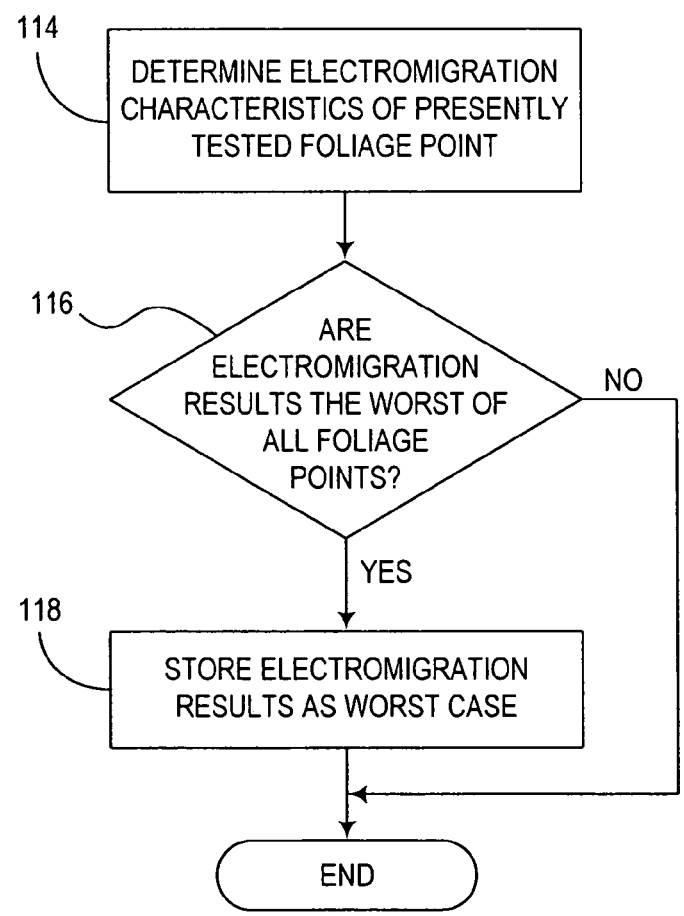
FIG. 11 is a flow chart showing an embodiment of the SPICE deck creating process shown in FIG. 9.

FIG. 11 is a flow chart illustrating an embodiment of a process for creating a SPICE deck. The functions of this process may correspond to block 96 shown in FIG. 9. In block 114, the electromigration characteristics of the presently tested foliage point are determined. Source code is used to simulate or mimic the electromigration effects for testing the foliage points. A program running this source code tests the electromigration under the frequency and load conditions mentioned with respect to FIG. 9. In decision block 116, it is determined whether or not the results of the electromigration characterization of block 114 produces the worst recorded electromigration results of all the tested foliage points. If it is the worst, then flow proceeds to block 118, where the current electromigration results are stored as the worst case of possible electromigration for the node. These worst case results are stored as part of the characterization of the standard cell, such that any connection to the node under test can be assured with more accuracy to be within acceptable operating conditions. Even if a connection is made from a route to the worst performing foliage point of the node, the semiconductor component should be able to meet the specified minimal characterization standards, assuming that all other factors are also acceptable. If it is determined in block 116 that the currently tested result is not the worst case, then the electromigration test results for that foliage point will be within acceptable limits and the SPICE deck subroutine ends.

The processes of the present disclosure, as defined with respect to FIGS. 5-11 are preferably implemented in software or firmware and stored in a memory device. Also, the processes are preferably executed by a suitable instruction execution system. The flow charts of FIGS. 5-11 show the architecture, functionality, and operation of possible implementations of standard cell characterization software. In this regard, each block represents a module, segment, or portion of code, which comprises one or more executable instructions for implementing the specified logical function(s). It should also be noted that in some alternative implementations, the functions noted in the blocks may occur out of the order noted or two or more blocks may in fact be executed substantially concurrently. Furthermore, the blocks may sometimes be executed in the reverse order, depending upon the functionality involved, as would be understood by those having reasonably skill in the art.

The flow charts may be included as a listing of executable instructions of software for implementing logical functions, whereby this software can be embodied in any "computer-readable medium" for use by a processing system, such as by a computer. A computer-readable medium can be any medium that can contain or store the software program and may be, for example, in any suitable form, such an electronic, magnetic, optical, etc. In addition, the scope of the present disclosure includes the functionality of the herein-disclosed embodiments configured with logic in hardware and/or software mediums.

The methods test each foliage point to find the breaking points where unacceptable electromigration effects can be predicted. As a result, the improved characterization of each standard cell allows a designer to predict with more certainty the failure limits of the standard cells. Another application of this disclosure includes determining the greatest limits of the standard cell and then characterizing the standard cell as being acceptable only up to a certain percentage of the greatest limits. By doing this, a reasonable margin of error will be factored into the characterization.

It should be emphasized that the embodiments described herein are merely examples of possible implementations, and are merely set forth for a clear understanding of the concepts and principles of the invention. Many variations and alternatives may be made to these embodiments without departing from the spirit and scope of the present disclosure. All such modification are included within the scope of the above-described embodiments and protected by the following claims.

We claim:

1. A method for testing the reliability of a semiconductor component, the method comprising:
   providing simulation code of a standard cell, the standard cell representing the semiconductor component;
   extracting foliage points of a node of the standard cell;
   running a reliability test on each foliage point; and
   characterizing the standard cell by the worst performing foliage point.

2. The method of claim 1, wherein the reliability test is an electromigration test.

3. The method of claim 1, wherein the node is an output node.

4. The method of claim 3, further comprising: determining which input of the standard cell produces the fastest switching time; holding other inputs static; and determining whether the fastest switching input is a 0-to-1 or 1-to-0 transition.

5. The method of claim 1, wherein extracting foliage points further comprises: analyzing the shape of the node; running a partitioning algorithm, based on the shape of the node, for splitting the shape into a number of separate foliage points; determining an equivalent RC circuit for each foliage point; and combining the RC circuits to create a circuit representing the node.

6. The method of claim 1, wherein running the reliability test further comprises: applying a frequency to the foliage points; connecting a load to the foliage points; increasing at least one of the frequency or load until the node is unable to operate within acceptable parameters.

7. The method of claim 1, further comprising: providing a source and load to the foliage points.

8. The method of claim 7, wherein providing a source further comprises: receiving an input of a target frequency; creating a piecewise linear source from the target frequency; and connecting power and ground foliage points of the standard cell to the piecewise linear source.

9. A method for improving the operating range of a standard cell, the method comprising:
   analyzing the shape of a node of a standard cell, the standard cell representing a semiconductor component;
   determining an operating range of the standard cell based on the shape of the node; and
   modifying the shape of the node to improve the operating range.

10. The method of claim 9, wherein analyzing the shape of the node further comprises: splitting the node into a plurality of foliage points; and testing the operating range of each foliage point.

11. The method of claim 10, wherein determining the operating range of the standard cell comprises determining the foliage point with the smallest operating range.

12. The method of claim 9, wherein the operating range corresponds to an acceptable operating performance based on a prediction of electromigration.

13. The method of claim 12, wherein the acceptable operating performance is based on the performance of the node based on one of a maximum frequency and a maximum capacitive load.

* * * * *